(12) United States Patent
Jang et al.

(10) Patent No.: US 7,999,567 B2
(45) Date of Patent: Aug. 16, 2011

(54) SEU TOLERANT ARBITER

(75) Inventors: Wonjin Jang, Jersey City, NJ (US);
Christopher D. Moore, Pasadena, CA
(US); Alain J. Martin, Pasadena, CA
(US)

(73) Assignee: California Institute of Technology,
Pasadena, CA (US)

( * ) Notice: Subject to any disclaimer, the term of this
patent is extended or adjusted under 35
U.S.C. 154(b) by 0 days.

(21) Appl. No.: 12/684,010

(22) Filed: Jan. 7, 2010

(65) Prior Publication Data

US 2010/0176841 A1    Jul. 15, 2010

Related U.S. Application Data

(60) Provisional application No. 61/204,493, filed on Jan. 7, 2009.

(51) Int. Cl.
*H03K 19/003* (2006.01)
(52) U.S. Cl. ............................. 326/9; 326/10; 326/14
(58) Field of Classification Search ............. 326/9–15, 326/94; 327/19
See application file for complete search history.

(56) References Cited

U.S. PATENT DOCUMENTS

| | | | |
|---|---|---|---|
| 2002/0017924 A1* | 2/2002 | Knowles | ........................ 326/119 |
| 2005/0259462 A1 | 11/2005 | Wood | |
| 2006/0001442 A1 | 1/2006 | Wood et al. | |
| 2007/0052442 A1 | 3/2007 | Fulkerson | |
| 2007/0103194 A1 | 5/2007 | Erstad | |
| 2007/0109865 A1 | 5/2007 | Maki et al. | |

OTHER PUBLICATIONS

International Search Report mailed Aug. 30, 2010, International application No. PCT/US2010/020385, International filing date Jan. 7, 2010.
International Search Report and Written Opinion, International application No. PCT/US2010/020387, International filing date Jan. 7, 2010, mailed Aug. 30, 2010.
Calhoun, B. et al., "A 256-kb 65-nm sub-threshold SRAM design for ultra-low-voltage operation," IEEE Journal of Solid-State Circuits, vol. 42, No. 3, Mar. 2007, pp. 680-688.
Liang, X. et al., "Process variation tolerant 3T1D-based cache architectures," 40th IEEE/ACM International Symposium on Microarchitecture, Dec. 1, 2007, pp. 15-26.
Zhai, B. et al, "A variation-tolerant sub-200 mV 6-T subthreshold SRAM," IEEE Journal of Solid-State Circuits, vol. 43, No. 10, Oct. 2008, pp. 2338-2348.

* cited by examiner

*Primary Examiner* — Rexford N Barnie
*Assistant Examiner* — Jany Tran
(74) *Attorney, Agent, or Firm* — Gates & Cooper LLP

(57) ABSTRACT

Single Event Upset (SEU, also referred to as soft error) tolerant arbiters, bare arbiters, and filters are disclosed. An arbiter provides a filter section, and a bare arbiter, coupled to the filter section. The bare arbiter includes a redundant first input and a redundant second input, and a redundant first output and a redundant second output. A pull-down transistor in the bare arbiter conditionally overpowers a corresponding pull-up transistor in the bare arbiter when a contention condition is present in the bare arbiter.

19 Claims, 4 Drawing Sheets

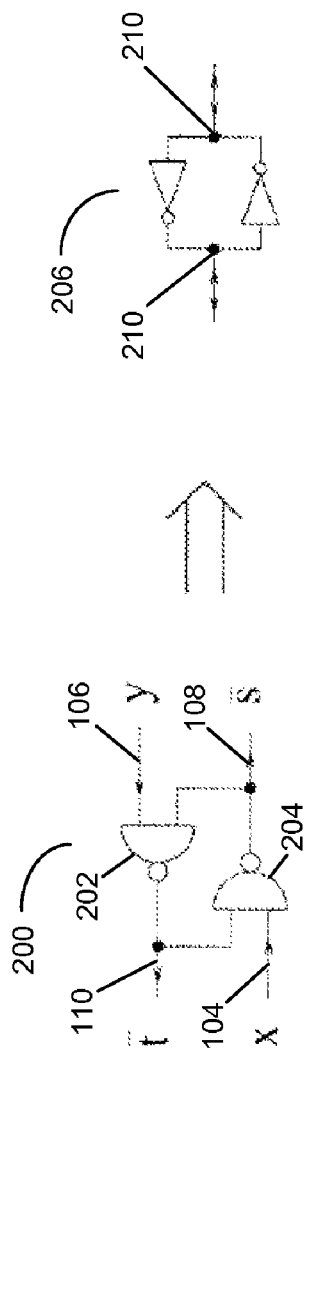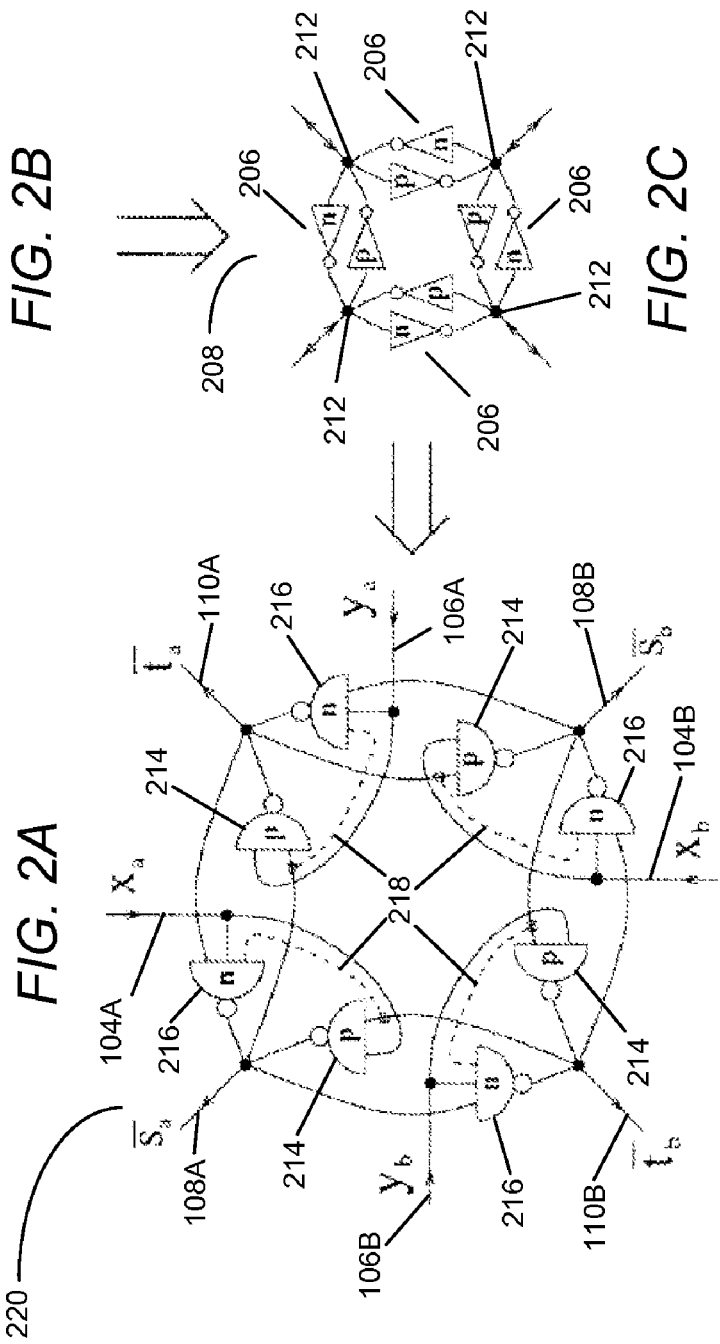

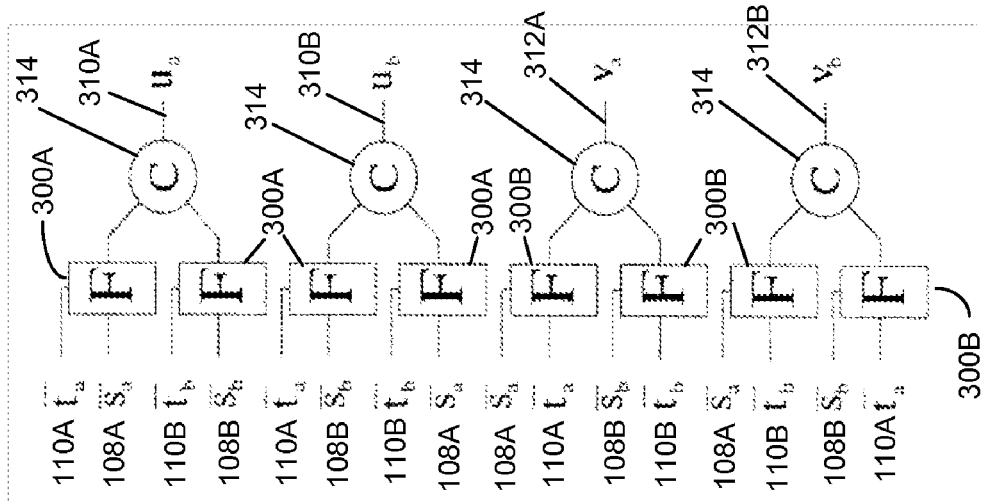
FIG. 3A
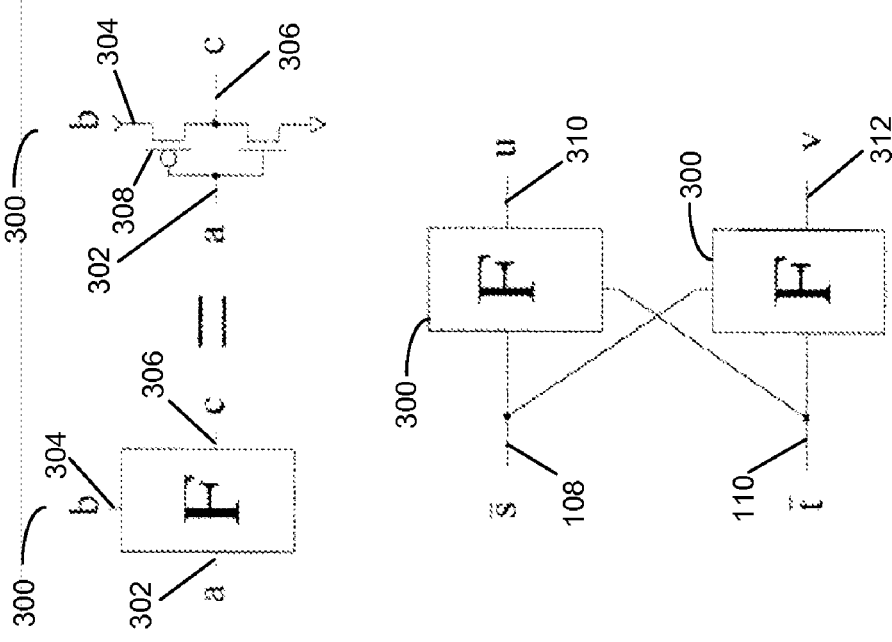
FIG. 3B
FIG. 3C

SEU TOLERANT ARBITER

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 61/204,493, filed on Jan. 7, 2009, by Wonjin Jang, Christopher D. Moore, and Alain J. Martin, entitled "SEU tolerant arbiter,".

STATEMENT REGARDING FEDERALLY SPONSORED RESEARCH AND DEVELOPMENT

The Government has certain rights in this invention pursuant to Grant No. CCF-0541461 awarded by the National Science Foundation (NSF).

BACKGROUND OF THE INVENTION

1. Field of the Invention

The present invention relates generally to arbiter circuits, and in particular, to a method, apparatus, and article of manufacture for a soft error tolerant arbiter circuit.

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

The arbiter is a circuit which plays a small but crucial role in a quasi delay insensitive (QDI) design. Any time that an input is required from a source that cannot provide a complete handshake, such as an external interrupt, the question of metastability comes up when sampling the input. The standard arbiter is the solution to this problem. The arbiter is specified as having two inputs and two outputs, and for the most part, its job is to mirror the state of the inputs onto the outputs. The exception to this rule is that when the inputs are both set to a logical 1, exactly one of the two outputs will be raised to a 1.

FIG. 1 shows the implementation of the standard arbiter 100 of the prior art. The first stage 102 of the arbiter 100, called the bare arbiter 102, is a rough approximation of the desired result of an arbiter 100. The only problem is that when both inputs x 104 and y 106 become logical "ones" (1), it is possible for the (inverted) outputs s 108 and t 110 to both become close to logical "zeros" (0). The second stage 112 is a simple analog filter which typically corrects this problem.

The arbiter is a non-deterministic circuit. While this is exactly what is necessary to deal with the issue of metastability, it also means that the DD (duplicated double-checking) scheme, the standard method of making a QDI circuit SEU (single event upset, also known as a "soft error") tolerant, cannot be applied. This DD scheme relies on making two copies of each circuit element, and only allowing the output of the elements to change when both elements can agree on the change. Any disagreement must be the result of a soft error, and will be resolved when the error passes. However, two arbiters given identical input can reach different outputs, which in the DD scheme, leads to a deadlock.

Accordingly, what is needed is an arbiter that is soft error tolerant.

SUMMARY OF THE INVENTION

One or more embodiments of the invention provide a scheme for performing arbitration in a way that can be integrated with circuitry using the standard DD scheme, and which is for practical purposes, completely invulnerable to a single soft error.

BRIEF DESCRIPTION OF THE DRAWINGS

Referring now to the drawings in which like reference numbers represent corresponding parts throughout:

FIGS. 2a-2d illustrate a DICE (dual interlocked cell) cell based bare arbiter in accordance with one or more embodiments of the invention;

FIGS. 3A-3C illustrate an SEU tolerant filter in accordance with one or more embodiments of the invention.

DETAILED DESCRIPTION OF THE PREFERRED EMBODIMENTS

Figure 1:
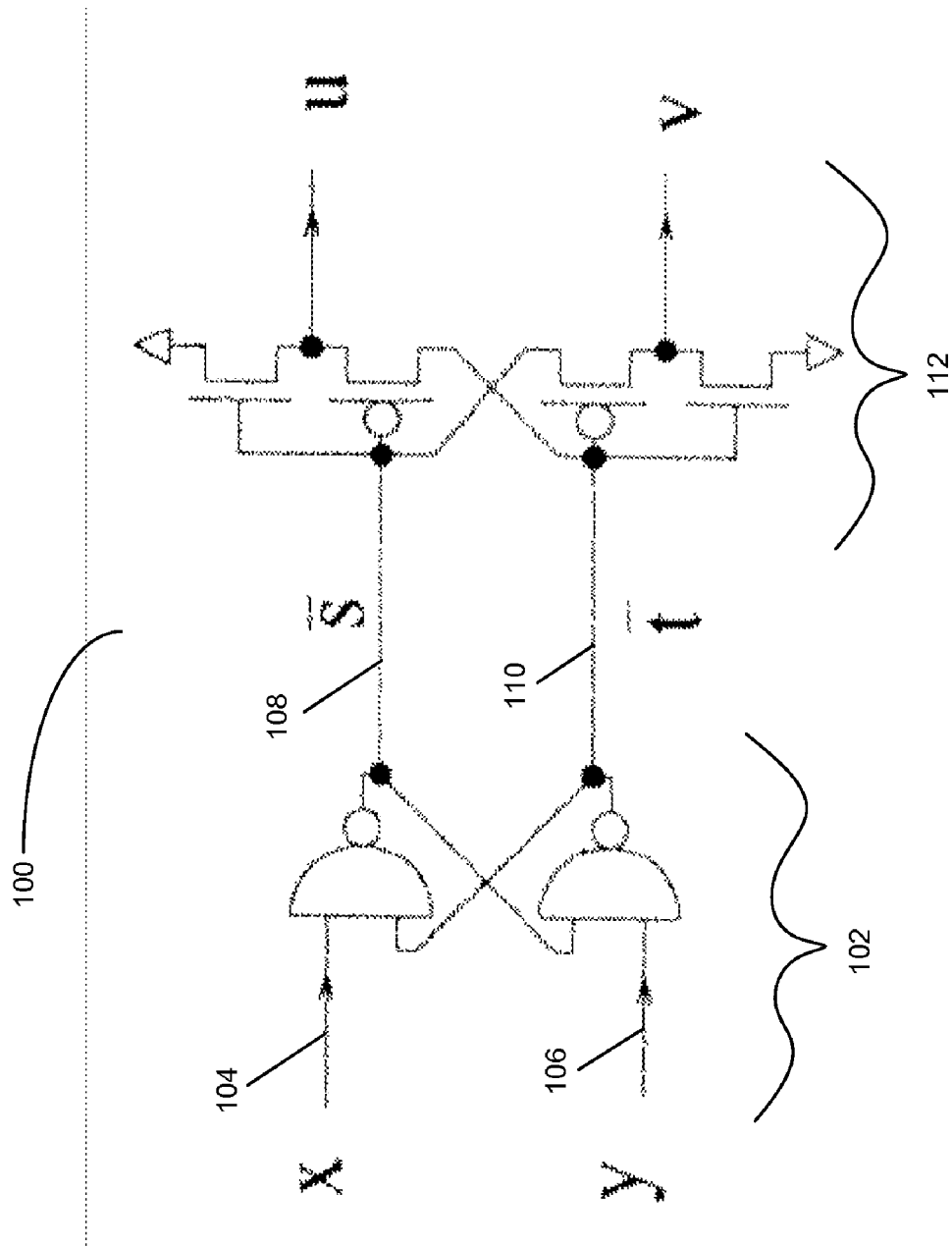
FIG. 1 illustrates a standard arbiter of the prior art.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Bare SEU Tolerant Arbiter

In trying to construct an arbiter that is soft error tolerant, the prior art considered building extra circuitry around one or more existing, non soft error tolerant arbiters (including additional analog circuitry). While such circuits may meet specifications, the circuits have all been too large to be of practical use.

Instead, in one or more embodiments of the invention, the individual elements that made up an arbiter are redesigned so that the new arbiter will be soft error tolerant from the group up.

FIG. 2A illustrates the bare arbiter 200 of the present invention. Inputs x 104 and y 106 are cross-coupled through nand gates 202 and 204. Such a configuration of nand gates 202 and 204 is typically known as a set-reset latch. The set-reset latch is more commonly used as a memory element, and is topologically similar to the standard six transistor SRAM cell 206, which is shown in FIG. 2B.

The DICE cell 208 in FIG. 2C couples four SRAM cells 206 in a ring fashion, which replaces the two internal storage nodes 210 with four internal storage nodes 212, although storage nodes are duplicates of the same logic values, so storage nodes 212 still only store one bit of data.

To represent the concept of the present invention compactly, FIG. 2D introduces p-type inverters 214 and n-type inverters 216, and shows inputs $x_a$ 104A and $x_b$ 104B as duplicate inputs, $y_a$ 106A and $y_b$ 106B as duplicate inputs, and outputs $s_a$ 108A and $s_b$ 108B as duplicate outputs, along with $t_a$ 110A and $t_b$ 110B as duplicate outputs. The n-inverters 216 pull the outputs low (to logic zero) if the input is high, while the p-inverter 214 pulls the outputs high (to a logic one) if the input is low.

To provide a design for the first stage of a soft error tolerant arbiter, a transformation that would transform the SRAM into the set-reset latch is applied to the DICE cell. This gives us the basis of FIG. 2D without the dashed lines 218. The n-inverter 216 pulls its output low if all of the inputs are high, while the p-inverter 214 pulls its output high if any of its inputs are low. For brevity, when a digital state of the four inputs or outputs is referred to herein (a state with all four nodes driven to one rail or the other), the order will be $x_a x_b y_a y_b$ or $\overline{s_a s_b t_a t_b}$.

One property that the bare arbiter needs to have is that when every input line 104A, 104B, 106A, and 106B is a one, the equations governing the output nodes must have exactly two stable equilibrium points. In other words, given an input of 1111 and any initial condition on the four output nodes, the state of the four output nodes must eventually converge to one of two desired states. Considering the circuit that can be derived directly from the DICE cell, there are only two stable states among the 16 digital output states (0011 and 1100). However, four (4) of these states avoid being a stable equilibrium only because some of the nodes are both pulled high and pulled low simultaneously (0101, 1010, 0110, and 1001). This leaves the possibility of an analog stable equilibrium state in the vicinity of one of these four (4) digital states.

To avoid an analog equilibrium state, the case where one node's pull up can overpower its corresponding pull down, while another node's pull down can overpower its pull up, should be avoided. Variation in transistor sizing will always make this a possibility, unless by design one of the two paths is weakened on every node during a conflict. However, for performance reasons one cannot simply make either path so weak unconditionally. Instead, one can conditionally weaken the pull down of a node by adding an input to the n-nand gate the input of the corresponding node's p-nand gate, as shown by connections 218. These connections 218 ensure that the pull up p-inverter 214 of a node can always overpower the pull down n-inverter 216 in case of a contention condition, without significantly weakening the pull down n-inverter 216 in the cases where there is no contention in the arbiter 220. A design in accordance with one or more embodiments of the present invention is shown in FIG. 2D, with the change marked by dashed lines 218.

For an input of 1111, this bare arbiter 220 has exactly two stable states: 0011 and 1100. For inputs of 1100, 0011, and 0000, each has only one stable output: 0011, 1100, and 1111, respectively. When one of the four inputs is low, the only thing that can affect the value of the corresponding output is a soft error on one of the corresponding output nodes, namely, nodes 108A, 108B, 110A, and 110B. When one of the inputs 104A, 104B, 106A, and 106B is high, but the corresponding output is also high, one can see by going through the stable states that match this condition that the other two inputs to the output's n-nand pull down must be low. Therefore a single soft error anywhere except on the output node itself cannot affect the value on the output node in this case. However, when an input is high and the corresponding output is low, a single soft error on a different output node can propagate to this output. Luckily, this soft error can only propagate one step clockwise in FIG. 2D from wherever it originates. The original node can also not have its pull up disabled nor its pull down enabled, so the error on the two nodes will still be transient. These possibilities are summarized in Table 1.

TABLE 1

Possible Deviations in Bare Arbiter Output Due to a Soft Error

| Input | Stable Output | Other Outputs | | | | | | |
|---|---|---|---|---|---|---|---|---|
| 0000 | 1111 | | | 1110 | 1101 | 1011 | 0111 | |
| 0011 | 1100 | 1101 | 1110 | 1000 | 1001 | 0100 | 0110 | |

TABLE 1-continued

Possible Deviations in Bare Arbiter Output Due to a Soft Error

| Input | Stable Output | Other Outputs | | | | | | |
|---|---|---|---|---|---|---|---|---|
| 1100 | 0011 | 0010 | 0101 | 0001 | 1010 | 0111 | 1011 | |
| 1111 | 1100 | 1101 | 1110 | 1000 | 1001 | 0100 | 0110 | |
| 1111 | 0011 | 0010 | 0101 | 0001 | 1010 | 0111 | 1011 | |

Having the correct number of stable states, and not allowing a permanent change in state, are preferable in the bare arbiter 220.

SEU Tolerant Filter

FIG. 3A illustrates a filter 300 building block design with input 302, input 304, and output 306. Such a design is similar to the filter 112 shown in FIG. 1, and is compatible with arbiter 100 as well as arbiter 220. Input 302 is typically referred to as gate input 302, and input 304 is typically referred to as passed input 304. The output 306 is pulled low when the gate input 302 is high, and the output 306 is pulled to the passed input 304 when the gate input 302 is low. Although this is a digital description of the filter 300, filter 300 is being used as an analog filter in one or more embodiments of the invention.

The property of this circuit (filter) 300 is that the voltage on the output 306 cannot be raised if the voltage on the passed input 304 minus the voltage of the gate input 302 is less than the threshold voltage of the p-transistor 308 in the filter 300. The standard arbiter 100 requires two such filter 300 blocks for a filter, as shown in FIG. 3B, to generate arbiter outputs 310 and 312. Once the bare arbiter's 100 outputs differ by more than a threshold voltage, the output state that the bare arbiter 100 will end on has already been decided. Therefore, when the inputs of a standard arbiter 100 both transition from 0 to 1, one of the outputs will transition completely from 0 to 1, while the other will not even partially transition away from 0.

A filter design in accordance with one or more embodiments of the present invention is shown in FIG. 3C, which illustrates a design employing eight filters 300 connected as shown. Each input, i.e., 108A, is coupled to a passed input 304 of one of the filters 300, and also connected to a gate input 302 of another (separate) filter 300, in both the top half of the filters 300A and the bottom half of the filters 300B.

When the bare arbiter 220 outputs 0011, the top four blocks (designated 300A) will raise their outputs, and when the output is 1100, the bottom four (designated 300B) will raise their outputs. The C elements 314 then take these quadruplicated outputs down to the standard DD outputs, i.e., outputs 310A, 310B, 312A, and 312B. If one examines the possible soft error states from the second and fourth rows of Table 1, one can see that in any of these states at most 3 of the 4 lower blocks will lower their outputs, and at most 1 of the upper blocks will lower its output. This means that such a soft error cannot raise either $u_a$ 310A or $u_b$ 310B, and can temporarily lower only one of $v_a$ 312A and $v_b$ 312B. A symmetric situation appears when considering rows three and five in Table 1. As for the first row, any of these soft errors can only raise the outputs of two of the filter blocks, but the way the blocks are paired means that none of the four outputs will be raised.

Another concern is that when the arbiter input transitions from 0000 to 1111 in just the wrong order, the bare arbiter 220 output may be able to reach an analog state close to one of the "other outputs" in rows two through five of Table 1, but without any soft error occurring. In such a case, the same analysis as above applies, but with the possibility that a soft error may occur on the output of one of the filters. A quick look at this possibility reveals that either a single error will occur on one of the four filter 300A/300B outputs, then revert itself, or that the filter 300A/300B outputs will prematurely reflect the stable output state of the bare arbiter 220.

Radiation Tolerance of Quasi Delay Insensitive (QDI) Design

As part of the feasibility of using a QDI design style to mitigate the effects of radiation on microprocessors, it is desirable to have some empirical evidence to support various theories that may be utilized. A QDI design style is typically placed on a Virtex™ 5 FPGA (field programmable gate array). Using a RAM (random access memory) based FPGA makes the job of recovering from a single event upset almost impossible, but the FPGA can be tested in a radiation environment that tends to only produce the Dose effect. The Dose effect merely affects the speed of the circuit, so it is considered something that the QDI design style is particularly well suited to deal with.

QDI Design

The basic building blocks of the QDI design style are so-called "buffer" templates. Any function that needs to be implemented is split up into stages of domino logic in a standard fashion. Then each stage of logic has a buffer template constructed around it. The buffer template drives the control signal of the domino logic, and coordinates with the surrounding templates.

This style is not the only possible way to implement QDI logic, but it has several properties that make it preferable for standard CMOS design. The forward latency from stage to stage is very close to the ideal domino logic latency. By keeping the blocks of domino logic very small, the throughput of each block of logic can be kept competitive with advanced synchronous pipelined systems. Additionally, all of the isochronic forks that occur in this design style are contained within a single buffer template. Isochronic forks are the one part of the design in which timing constraints factor into whether or not the circuit will behave as desired, and the one part of the design process where the layout of the circuit is critical. So keeping isochronic forks contained within small blocks of logic is helpful.

FPGA (Field Programmable Gate Array) Implementation

These considerations ultimately make this same style of design optimal for implementation on the Virtex™ 5 FPGA. The Virtex™ 5 has several types of building blocks, and the six input LUTs (look up tables) are of suitable use for the QDI design style. At first, it would appear as though mapping domino logic directly onto 6 input LUTs is a poor design choice. However, the QDI design style requires that every logical value always be encoded using a delay insensitive code, and dual rail encoding is the most compact DI (delay insensitive) code that can realistically be used. Additionally, the forward computational path requires periodic elements that can conditionally delay the forward propagation of valid data values, as well as elements that can control the resetting of the data values. Placing these elements on every LUT on the computational path takes away two of the six inputs for non computational purposes, which turns out to be desirable for reasons discussed later. There are multiple ways to achieve the desired effects using only two inputs, but the one that minimizes the amount of extra control logic turns out to be the method that results from mapping domino logic directly onto the 6 input LUTs. In this method, the output of each LUT is fed back as an input to itself, turning the combinational LUT into a state holding elements. The other non computational input of the LUT is the domino logic "clocking" signal, generally referred to in QDI design as the "go" signal.

Figure 4:
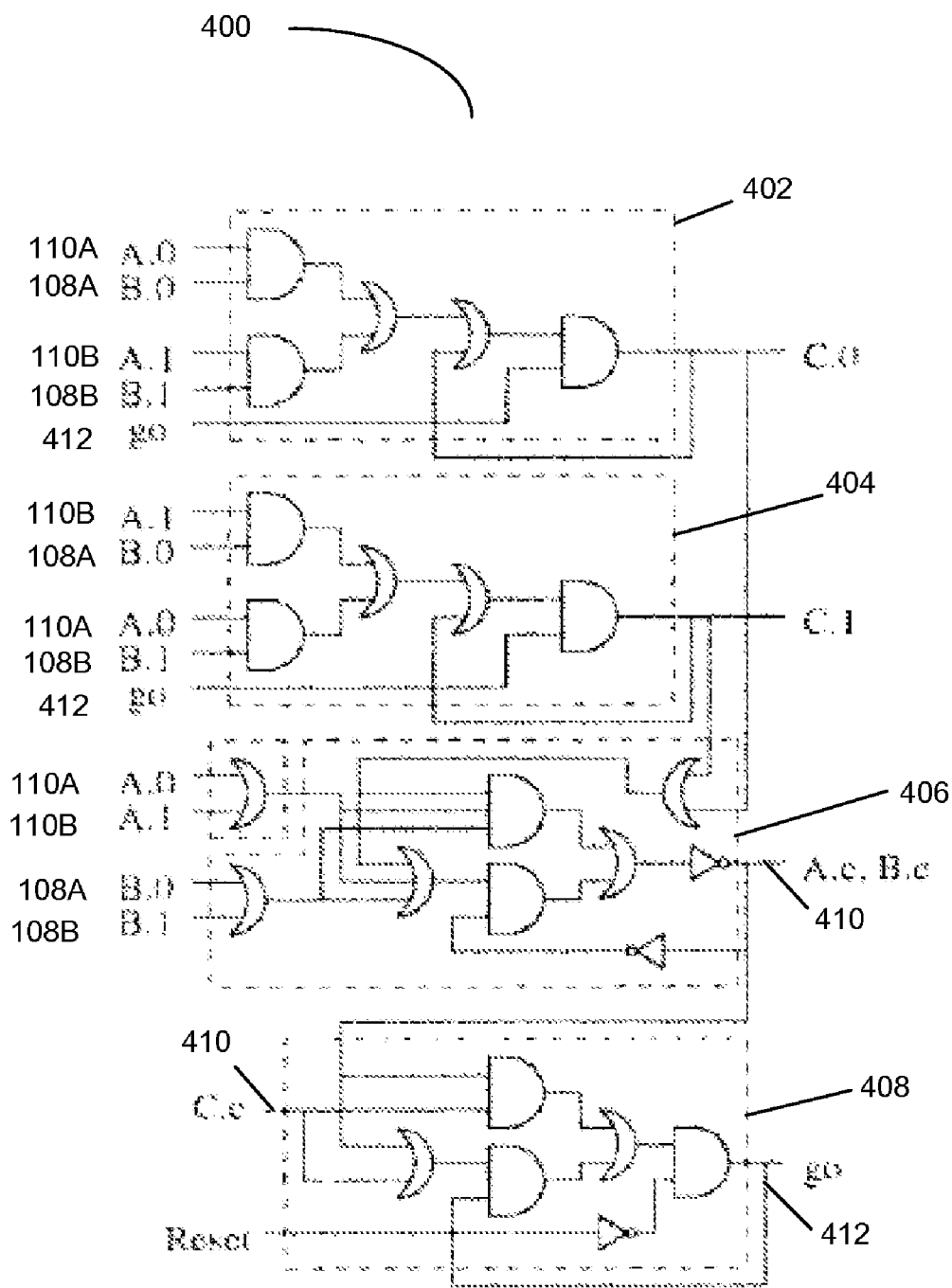
FIG. 4 illustrates a buffer template for an XOR function in accordance with one or more embodiments of the invention.

Shown in FIG. 4 is an FPGA implementation of the domino logic XOR gate 400 of filter 300A (or 300B), and the complete surrounding buffer template. Each region 402-408 enclosed by a dotted line is implemented by a single LUT. The top two LUTs 402 and 404 form the domino logic for filter 300A, while the bottom two LUTs 406 and 408 form the remainder of the buffer template. If an entire design is decompressed into these blocks, the only consideration necessary to ensure the functionality of such a design are that of isochronic forks.

Although described with respect to blocks 300A, the description of gate 400 can also be applied to blocks 300B. As shown in FIG. 4, inputs 108A, 108B, 110A, and 110B are applied to regions 402 and 404, in a similar fashion to that shown to blocks 300A shown in FIG. 3. The logic shown in regions 402 and 404 result in outputs 310A and 310B.

In region 406, inputs 108A, 108B, 110A, and 110B are input to region 406 to provide a feedback as input 410 to region 408. When the inputs 108A, 108B, 110A, and 110B have a soft error, which creates a transition, the change in state in region 406 must reach the output 410 of region 406, and travel through region 408, to provide a clocking (go) signal 412 to regions 402 and 404, and the new value must reach the feedback input before an adversary path along another fork of the output path invalidates the condition that caused the transition of the output.

However, the critical forks in regions 402 and 404 need only pass from one LUT to the nearest routing table and back, while by design any adversary path through regions 406 and 408 would need to make several trips at least as long as this. So this type of isochronic fork is safe without any additional consideration.

The other isochronic forks are more difficult to deal with. There are isochronic forks between all of the LUT inputs connected to regions 402-408, e.g., inputs A.0, A.1, B.0, B.1, and go. Although signals such as A.0 are generated outside of the buffer template, the isochronic fork is said to exist only within the buffer template. As long as the external signals 108A, 108B, 110A, and 110B are routed through a single path to the layout regions 402-408 on the buffer template, and the fork between the nodes exists only within the regions 402-408, then this is an accurate description of the situation. Furthermore, if the layout region is not too large, then this ensures that this isochronic timing assumption will actually be met.

On the FPGA, the additional constraints are enforced by requiring all branches of these isochronic forks to be in the same slice of the four LUTs. External signals will then first be routed to the routing table nearest the slice, and from the routing table branch off to the various LUTs. In FIG. 4, the top four LUTs would go in one slice, while the bottom LUT would go in another slice. Note that this is the reason why each computational LUT needed to have its own control signal. Increasing the control spacing causes the number of LUTs that need to use the same routing table to increase beyond what can be accommodated.

With the isochronic fork problem solved, a fully robust base on which any design may be implemented is achieved. Of course, even though the performance of QDI design has been optimized on the Virtex™ 5, the performance still falls far short of clocked designs on the Virtex™ 5. The main reason for this is that the 6 input LUTs is being utilized as 2 input LUTs. This means a factor of up to 5 increase in the latency of a computation stage, and an even greater increase in the number of LUTs used.

Test Circuit

The components that had already been developed for use in the divider were assembled into a much simpler circuit. This circuit is based around an 8 bit counter that is set up to repeatedly count from 1 to 255, always skipping zero. The counter originally had a full 8 bit output to feed to the divisor input of the divider, but this was replaced by a boolean output indicating whether or not the counter just rolled over. Another small block included, the alternator, has a single output that alternates between 0 and 1. The final block takes the two listed outputs, and copies the value from the alternator output to an internal node whenever the counter's output indicates that the count has rolled over. This internal node is what is externally visible during circuit testing.

The above described circuit has several advantages over a simpler oscillating circuit. First of all, if any single bit were to be changed while the circuit was running, the circuit would either deadlock, or dramatically increase the oscillation frequency. Additionally, the alternator naturally runs much faster than the counter, so if the block that drives the output cannot keep its two inputs in sync, the counter's rollover may coincide with the same value from the alternator twice in a row, and the output oscillation will skip a beat. It is possible for a change in the logical value of a dual rail signal to go unnoticed at the output, but this would require two actual bits to simultaneously change. So this circuit is actually a very good barometer for what happens to other circuits under radiation.

Results

Simulating the circuit under no radiation gives a consistent output frequency of about 300 KHz, which means that the counter is incrementing at an approximate rate of 150 MHz. Under radiation testing, the QDI circuit maintains functionality at a much higher dose of radiation than a synchronous circuit of equivalent performance. Given a high enough dose of radiation, the QDI circuit will halt the oscillation, and the oscillation does not return when the radiation is finished. The cause of this halt is unknown, but it is possible that a bit flipped by the radiation.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

Embodiments of the invention provide results that show great promise for a radiation tolerant CMOS QDI microprocessor. The robustness of the circuit can only increase as one moves away from the RAM based Virtex™ 5, and additionally providing a huge increase in performance.

Although there are possibilities for the arbiter of the present invention to fail because there can exist a very short window of time in which the analog state of the bare arbiter 220 is such that all four of the filter blocks 300A/300B for a given stable state are able to raise their outputs from zero, and a soft error in the bare arbiter can switch the final output to the other stable state. However, this is not a problem in practice, because for reasonably small supply voltages, the size of this window shrinks to zero, and because even when the window has finite size, having a soft error within that window is less likely than having two soft errors coincide and break the system.

Embodiments of the present invention discloses single event upset (SEU, also referred to as soft error) tolerant arbiters, bare arbiters, and filters. An arbiter in accordance with one or more embodiments of the present invention comprises a filter section, and a bare arbiter, coupled to the filter section, the bare arbiter comprising a redundant first input and a redundant second input, and a redundant first output and a redundant second output, wherein a pull-down transistor in the bare arbiter conditionally overpowers a corresponding pull-up transistor in the bare arbiter when a contention condition is present in the bare arbiter.

Such an arbiter further optionally comprises three stable outputs of 0011, 1100, and 1111 for any combination of redundant first inputs and redundant second inputs, a plurality of pull-down transistors and a plurality of pull-up transistors, each pull-down transistor in the plurality of pull-down transistors conditionally overpowering a corresponding pull-up transistor in the plurality of pull-up transistors, the pull-down transistor conditionally overpowering the corresponding pull-up transistor through coupling of an input of the pull-down transistor to an input of the corresponding pull-up transistor, the filter section comprising a plurality of filter blocks, each filter block in the plurality of filter blocks comprising a gate input and a passed input, the redundant first outputs and the redundant second outputs of the bare arbiter being coupled to the plurality of filter blocks such that each output is coupled to a gate input of a filter block in the plurality of filter blocks and each output is also coupled to a passed input of a separate filter block in the plurality of filter blocks, for each output of the filter section, the redundant first outputs and the redundant second outputs of the bare arbiter are coupled to the plurality of filter blocks such that each output is coupled to a gate input of a filter block in the plurality of filter blocks and each output is also coupled to a passed input of a separate filter block in the plurality of filter blocks, and the filter section being implemented in a field programmable gate array.

A single event upset (SEU) tolerant bare arbiter in accordance with one or more embodiments of the present invention comprises a redundant first input and a redundant second input, and a redundant first output and a redundant second output, wherein a pull-down transistor in the bare arbiter conditionally overpowers a corresponding pull-up transistor in the bare arbiter only when a contention condition is present in the bare arbiter.

Such a bare arbiter further optionally comprises the pull-down transistor conditionally overpowering the corresponding pull-up transistor in the plurality of pull-up transistors through coupling of an input of the pull-down transistor to an input of the corresponding pull-up transistor, a filter section coupled to the SEU tolerant bare arbiter, the filter section further comprising a plurality of filter blocks, each filter block in the plurality of filter blocks comprising a gate input and a passed input, the redundant first outputs and the redundant second outputs of the bare arbiter being coupled to the plurality of filter blocks such that each output is coupled to a gate input of a filter block in the plurality of filter blocks and each output is also coupled to a passed input of a separate filter block in the plurality of filter blocks, for each output of the filter section, the redundant first outputs and the redundant second outputs of the bare arbiter are coupled to the plurality of filter blocks such that each redundant output is coupled to a gate input of a filter block in the plurality of filter blocks and each output is also coupled to a passed input of a separate filter block in the plurality of filter blocks, and the filter section being implemented in a field programmable gate array.

A filter section for a single event upset (SEU) tolerant arbiter in accordance with one or more embodiments of the present invention comprises a plurality of filter blocks, each filter block in the plurality of filter blocks comprising a gate input and a passed input, wherein redundant first outputs and redundant second outputs of a bare arbiter are coupled to the plurality of filter blocks such that each output is coupled to a gate input of a filter block in the plurality of filter blocks and each output is also coupled to a passed input of a separate filter block in the plurality of filter blocks, the filter section being implemented in a field programmable gate array, for each output of the filter section, the redundant first outputs and the redundant second outputs of the bare arbiter are coupled to the plurality of filter blocks such that each redundant output is coupled to a gate input of a filter block in the plurality of filter blocks and each output is also coupled to a passed input of a separate filter block in the plurality of filter blocks, and the filter section comprising isochronic forks for invalidating SEU events.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[1] T. Calin, M. Nicolaidis, R. Velazco, Unset hardened memory design for sub-micron CMOS technology, *IEEE Transactions on Nuclear Science*, Volume 43, Issue 6, pp. 2784-2878, December 1996.

What is claimed is:

1. A single event upset (SEU) tolerant arbiter, comprising:
   a bare arbiter, containing a filter section, the bare arbiter comprising:
      a redundant first input and a redundant second input, and
      a redundant first output and a redundant second output, wherein a pull-down transistor in the bare arbiter conditionally overpowers a corresponding pull-up transistor in the bare arbiter when a contention condition is present in the bare arbiter, wherein the bare arbiter has three stable outputs of 0011, 1100, and 1111 for any combination of redundant first inputs and redundant second inputs.

2. The SEU tolerant arbiter of claim 1, wherein the bare arbiter further comprises a plurality of pull-down transistors and a plurality of pull-up transistors.

3. The SEU tolerant arbiter of claim 2, wherein each pull-down transistor in the plurality of pull-down transistors conditionally overpowers a corresponding pull-up transistor in the plurality of pull-up transistors.

4. The SEU tolerant arbiter of claim 1, wherein the pull-down transistor conditionally overpowers the corresponding pull-up transistor through coupling of an input of the pull-down transistor to an input of the corresponding pull-up transistor.

5. The SEU tolerant arbiter of claim 1, wherein the filter section comprises a plurality of filter blocks, each filter block in the plurality of filter blocks comprising a gate input and a passed input.

6. The SEU tolerant arbiter of claim 5, wherein the redundant first outputs and the redundant second outputs of the bare arbiter are coupled to the plurality of filter blocks such that each redundant output is coupled to a gate input of a filter block in the plurality of filter blocks and each redundant output is also coupled to a passed input of a separate filter block in the plurality of filter blocks.

7. The SEU tolerant arbiter of claim 5, wherein, for each output of the filter section, the redundant first outputs and the redundant second outputs of the bare arbiter are coupled to the plurality of filter blocks such that each redundant output is coupled to a gate input of a filter block in the plurality of filter blocks and each redundant output is also coupled to a passed input of a separate filter block in the plurality of filter blocks.

8. The SEU tolerant arbiter of claim 7, wherein the filter section is implemented in a field programmable gate array.

9. A single event upset (SEU) tolerant bare arbiter, comprising:
   a redundant first input and a redundant second input, and
   a redundant first output and a redundant second output, wherein a pull-down transistor in the bare arbiter conditionally overpowers a corresponding pull-up transistor in the bare arbiter only when a contention condition is present in the bare arbiter, and wherein the bare arbiter has three stable outputs of 0011, 1100, and 1111 for any combination of redundant first inputs and redundant second inputs.

10. The SEU tolerant bare arbiter of claim 9, wherein the pull-down transistor conditionally overpowers the corresponding pull-up transistor through coupling of an input of the pull-down transistor to an input of the corresponding pull-up transistor.

11. The SEU tolerant bare arbiter of claim 9, further comprising a filter section.

12. The SEU tolerant bare arbiter of claim 9, wherein the filter section further comprises a plurality of filter blocks, each filter block in the plurality of filter blocks comprising a gate input and a passed input.

13. The SEU tolerant bare arbiter of claim 12, wherein the redundant first outputs and the redundant second outputs of the bare arbiter are coupled to the plurality of filter blocks such that each redundant output is coupled to a gate input of a filter block in the plurality of filter blocks and each redundant output is also coupled to a passed input of a separate filter block in the plurality of filter blocks.

14. The SEU tolerant bare arbiter of claim 13, wherein, for each output of the filter section, the redundant first outputs and the redundant second outputs of the bare arbiter are coupled to the plurality of filter blocks such that each redundant output is coupled to a gate input of a filter block in the plurality of filter blocks and each redundant output is also coupled to a passed input of a separate filter block in the plurality of filter blocks.

15. The SEU tolerant bare arbiter of claim 14, wherein the filter section is implemented in a field programmable gate array.

16. A filter section for a single event upset (SEU) tolerant arbiter, comprising:
   a plurality of filter blocks, each filter block in the plurality of filter blocks comprising a gate input and a passed input, wherein:
   redundant first outputs and redundant second outputs are coupled to the plurality of filter blocks such that each output is coupled to a gate input of a filter block in the plurality of filter blocks and each output is also coupled to a passed input of a separate filter block in the plurality of filter blocks, and wherein the SEU tolerant arbiter has three stable outputs of 0011, 1100, and 1111 for any combination of redundant first inputs and redundant second inputs.

17. The filter section of claim 16, wherein the filter section is implemented in a field programmable gate array.

18. The filter section of claim 17, wherein, for each output of the filter section, the redundant first outputs and the redundant second outputs of the bare arbiter are coupled to the plurality of filter blocks such that each redundant output is coupled to a gate input of a filter block in the plurality of filter blocks and each output is also coupled to a passed input of a separate filter block in the plurality of filter blocks.

19. The filter section of claim 18, wherein the filter section comprises isochronic forks for invalidating SEU events.

* * * * *

UNITED STATES PATENT AND TRADEMARK OFFICE
CERTIFICATE OF CORRECTION

| | | |
|---|---|---|
| PATENT NO. | : 7,999,567 B2 | Page 1 of 1 |
| APPLICATION NO. | : 12/684010 | |
| DATED | : August 16, 2011 | |
| INVENTOR(S) | : Jang et al. | |

It is certified that error appears in the above-identified patent and that said Letters Patent is hereby corrected as shown below:

In the Specification

<u>Column 1</u>

Line 18, please delete "The Government has certain rights in this invention pursuant to Grant No. CCF-0541461 awarded by the National Science Foundation (NSF)."

and insert --This invention was made with government support under FA9453-08-M-0026 awarded by US Air Force. The government has certain rights in the invention.--

Signed and Sealed this
Twenty-second Day of April, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 7,999,567 B2  
APPLICATION NO. : 12/684010  
DATED : August 16, 2011  
INVENTOR(S) : Jang et al.

Page 1 of 1

It is certified that error appears in the above-identified patent and that said Letters Patent is hereby corrected as shown below:

In the Specification

<u>Column 1</u>

Line 18, please delete "The Government has certain rights in this invention pursuant to Grant No. CCF-0541461 awarded by the National Science Foundation (NSF)."

and insert --This invention was made with government support under Grant No. CCF0541461 awarded by the National Science Foundation and under Grant No. FA9453-08-M-0026 awarded by the U.S. Air Force. The government has certain rights in the invention.--

This certificate supersedes the Certificate of Correction issued April 22, 2014.

Signed and Sealed this  
First Day of July, 2014

Michelle K. Lee  
*Deputy Director of the United States Patent and Trademark Office*